United States Patent
Xue et al.

(10) Patent No.: US 12,243,939 B2
(45) Date of Patent: Mar. 4, 2025

(54) LATERALLY DIFFUSED METAL-OXIDE SEMICONDUCTOR (LDMOS) TRANSISTOR WITH INTEGRATED BACK-GATE

(71) Applicant: TEXAS INSTRUMENTS INCORPORATED, Dallas, TX (US)

(72) Inventors: Gang Xue, San Jose, CA (US); Pushpa Mahalingam, Richardson, TX (US); Alexei Sadovnikov, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 216 days.

(21) Appl. No.: 17/515,531

(22) Filed: Oct. 31, 2021

(65) Prior Publication Data

US 2023/0136827 A1 May 4, 2023

(51) Int. Cl.
*H01L 29/78* (2006.01)
*H01L 29/423* (2006.01)
*H01L 29/45* (2006.01)
*H01L 29/66* (2006.01)

(52) U.S. Cl.
CPC .... *H01L 29/7816* (2013.01); *H01L 29/42368* (2013.01); *H01L 29/456* (2013.01); *H01L 29/66681* (2013.01)

(58) Field of Classification Search
CPC .......... H01L 29/66681–66704; H01L 29/7816–7826; H01L 29/42368
See application file for complete search history.

(56) References Cited

U.S. PATENT DOCUMENTS

| | | | |
|---|---|---|---|
| 5,719,421 A * | 2/1998 | Hutter | H01L 29/7816 257/E29.066 |
| 10,461,182 B1 * | 10/2019 | Edwards | H01L 29/0882 |
| 2004/0251492 A1 * | 12/2004 | Lin | H01L 29/66689 257/E21.345 |
| 2006/0186467 A1 * | 8/2006 | Pendharkar | H01L 29/749 257/E27.06 |
| 2006/0186477 A1 * | 8/2006 | Kanda | H01L 29/1083 257/E29.063 |
| 2019/0172946 A1 * | 6/2019 | Wu | H01L 21/28518 |

* cited by examiner

*Primary Examiner* — Walter H Swanson
*Assistant Examiner* — Jacob T Nelson
(74) *Attorney, Agent, or Firm* — Andrew R. Ralston; Frank D. Cimino

(57) ABSTRACT

Described examples include an integrated circuit having a transistor with a first gate on a first gate insulating layer. The transistor also has second gate separated from the first gate by a gate gap. The integrated circuit also includes a channel well at the gate gap extending under the first gate and the second gate. The transistor has a first source in the channel adjacent to an edge of the first gate. The transistor having a second source formed in the channel adjacent to an edge of the second gate separated from the first source by a channel gap. The transistor has at least one back-gate contact, the at least one back-gate contact separated from the first gate by a first back-gate contact gap and separated from the second gate by a second back-gate contact gap.

20 Claims, 11 Drawing Sheets

LATERALLY DIFFUSED METAL-OXIDE SEMICONDUCTOR (LDMOS) TRANSISTOR WITH INTEGRATED BACK-GATE

TECHNICAL FIELD

This relates generally to semiconductor transistors, and more particularly, but not exclusively, to laterally diffused metal-oxide semiconductor (LDMOS) transistors.

BACKGROUND

LDMOS transistors are designed for higher power applications as compared to other metal-oxide semiconductor (MOS) transistors. In LDMOS transistors, the drain and source have a large spacing between them and the transistor has lateral diffusions that are used to produce a well-controlled channel region under the gate. However, to provide the necessary power handling capability, LDMOS transistors must be much larger than MOS transistors. Some examples of LDMOS transistors are configured in large ovals or, as further explained hereinbelow, in long back-to-back strips. In some applications, LDMOS transistors consume the majority of the surface area of an integrated circuit. Therefore, any savings in the size of LDMOS transistors can result in a large savings of valuable integrated circuit area.

SUMMARY

In accordance with an example, an integrated circuit includes a semiconductor substrate having a first conductivity and a drain region having a second conductivity in the semiconductor substrate, the drain region extending in a first direction. The integrated circuit also includes a first gate insulating layer on the drain region extending in the first direction and a first gate on the first gate insulating layer, the first gate extending in the first direction. The integrated circuit also includes a second gate insulating layer extending in the first direction on the drain region, the second gate insulating layer separated from the first gate insulating layer by a gate gap and a second gate on the second gate insulating layer, the second gate extending in the first direction and separated from the first gate by the gate gap. The integrated circuit also includes a first drain having the second conductivity in the drain region extending in the first direction and on an opposite side of the first gate from the gate gap and a second drain having the second conductivity in the drain region extending in the first direction and on an opposite side of the second gate from the gate gap. The integrated circuit also includes a channel well having the first conductivity in the drain region at the gate gap, the channel well extending in the first direction and extending in a second direction perpendicular to the first direction under the first gate and the second gate and a first source having the second conductivity formed in the channel adjacent to an edge of the first gate, the first source extending in the first direction. The integrated circuit also includes a second source having the second conductivity formed in the channel adjacent to an edge of the second gate, the second source extending in the first direction and separated from the first source by a channel gap and at least one back-gate contact formed in the channel well between the first gate and the second gate, the at least one back-gate contact separated from the first gate by a first back-gate contact gap and separated from the second gate by a second back-gate contact gap. The integrated circuit also includes a source contact formed in the channel well in the gate gap except at the at least one back-gate contact and a conductive layer formed in contact with the at least one back-gate contact and the source contact.

DETAILED DESCRIPTION

Figure 1:
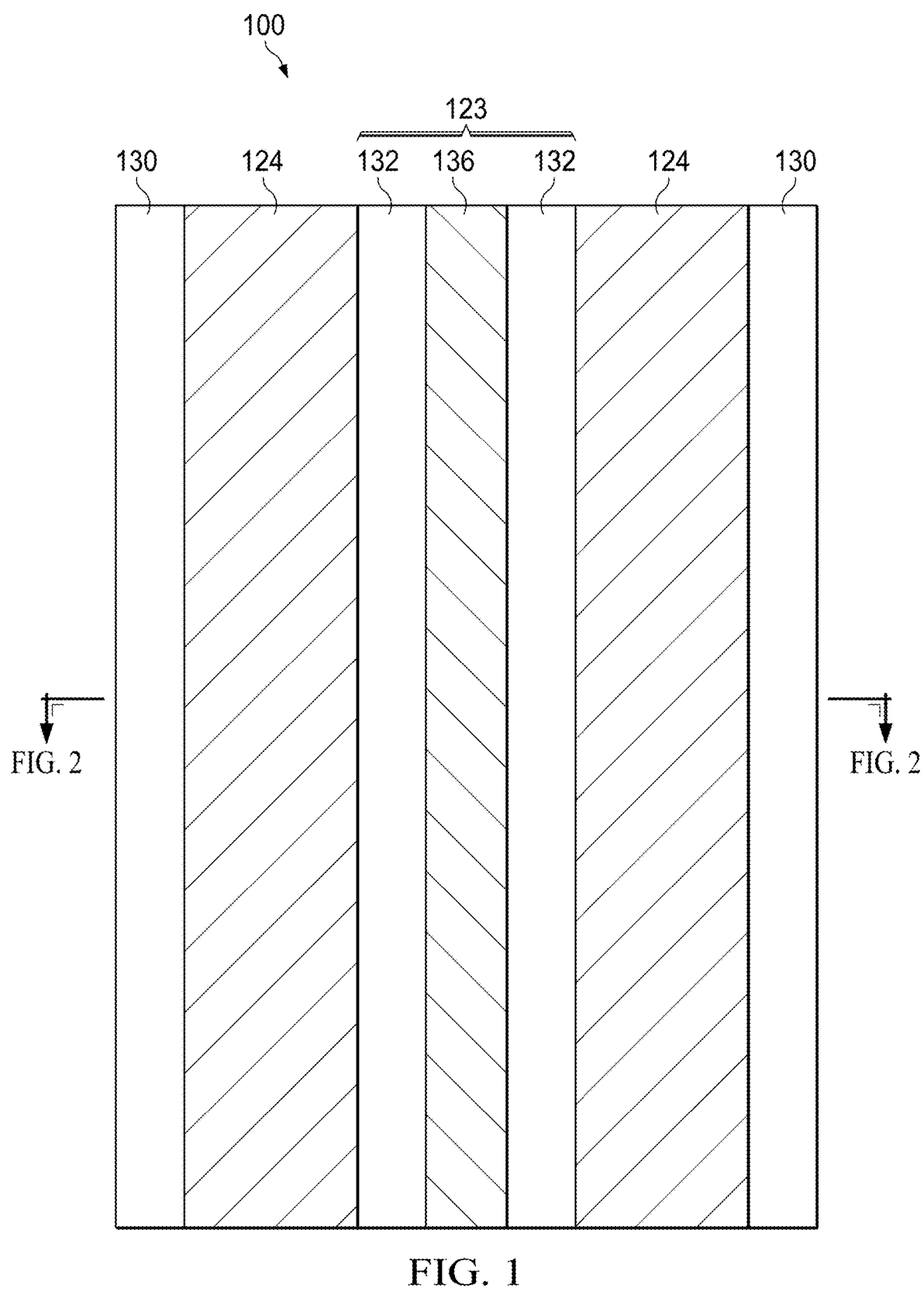
FIG. 1 is a plan view of an example baseline LDMOS configuration.

In the drawings, corresponding numerals and symbols generally refer to corresponding parts unless otherwise indicated. The drawings are not necessarily drawn to scale.

In this description, the term "coupled" may include connections made with intervening elements, and additional elements and various connections may exist between any elements that are "coupled." Also, as used herein, the terms "on" and "over" may include layers or other elements where intervening or additional elements are between an element and the element that it is "on" or "over."

In example arrangements, the problem of providing a more compact LDMOS structure with high performance is solved by back-gate contact diffusions that extend across the gap between gates in a back-to-back LDMOS configuration where there is a defined space between the gates and back-gate diffusions. In an example, an integrated circuit includes a semiconductor substrate having a first conductivity and a drain region having a second conductivity in the semiconductor substrate, the drain region extending in a first direction. The integrated circuit also includes a first gate insulating layer on the drain region extending in the first direction and a first gate on the first gate insulating layer, the first gate extending in the first direction. The integrated circuit also includes a second gate insulating layer extending in the first direction on the drain region, the second gate insulating layer separated from the first gate insulating layer by a gate gap and a second gate on the second gate insulating layer, the second gate extending in the first direction and separated from the first gate by the gate gap. The integrated circuit also includes a first drain having the second conductivity in the drain region extending in the first direction and on an opposite side of the first gate from the gate gap and a second drain having the second conductivity in the drain region extending in the first direction and on an opposite side of the second gate from the gate gap. The integrated circuit also includes a channel well having the first conductivity in the drain region at the gate gap, the channel well extending in the first direction and extending in a second direction perpendicular to the first direction under the first gate and the second gate and a first source having the second conductivity formed in the channel adjacent to an edge of the first gate, the first source extending in the first direction. The integrated circuit also includes a second source having the second conductivity formed in the channel adjacent to an edge of the second gate, the second source extending in the first direction and separated from the first source by a channel gap and at least one back-gate contact formed in the channel well between the first gate and the second gate, the at least one back-gate contact separated from the first gate by a first back-gate contact gap and separated from the second gate by a second back-gate contact gap. The integrated circuit also includes a source contact formed in the channel well in the gate gap except at the at least one back-gate contact and a conductive layer formed in contact with the at least one back-gate contact and the source contact.

FIG. 1 is a plan view of an example integrated circuit (IC) 100 including an LDMOS configuration that is representative of some baseline configurations. The IC includes two LDMOS transistors that are configured to operate together to provide a transistor function. As explained further hereinbelow with regard to FIG. 2, each LDMOS transistor includes corresponding gates 124 that are separated by a gate gap 123 that includes a back-gate contact between two source contacts 132. One gate 124 is between one drain contact 130 and one source contact 132, and another gate 124 is between a second drain contact 130 and a second source contact 132. Each of these components extends laterally in a length direction over a substrate 102 (FIG. 2), e.g. in the vertical direction relative to the page in FIG. 1. The transistors may be regarded as back-to-back LDMOS sections. In many configurations, the transistors extend much farther than shown in FIG. 1 and include multiple back-to-back LDMOS sections. There may be dozens of sections to provide the necessary power handling capability for the intended application of the IC 100. Example applications include RF transmitters and automotive controls. For example, an LDMOS transistor may control power applied to headlights in an automobile. The specific examples described herein do not limit the application of LDMOS transistors. LDMOS transistors may be useful in many applications.

Figure 2:
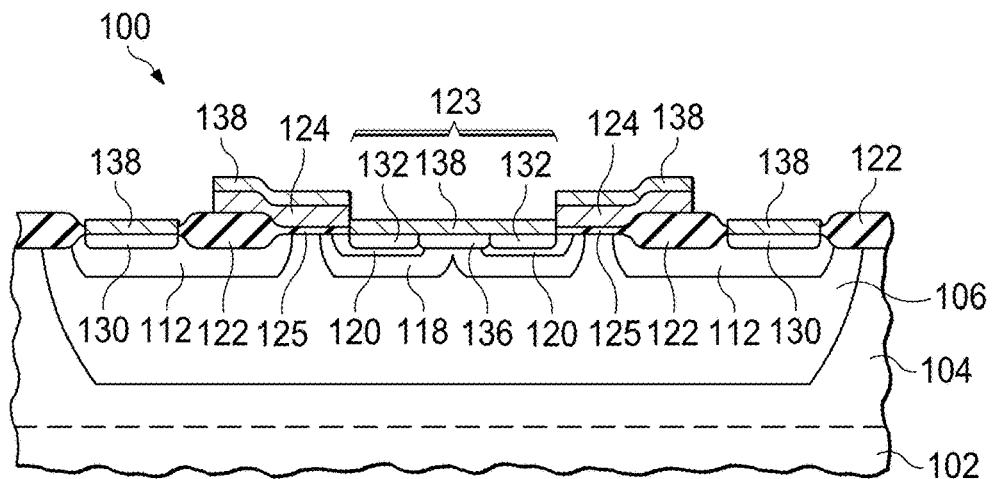
FIG. 2 is a cross sectional view of the LDMOS transistor of FIG. 1 from the cut line indicated in FIG. 1.

FIG. 2 is a cross sectional view of the IC 100 from the cut line indicated in FIG. 1. As explained further hereinbelow with regard to FIG. 2, n-well 106 is formed in or over a semiconductor substrate including a lightly doped p-type epitaxial ("epi") layer 104 over p-type substrate 102. N-type drain regions 112 are formed in n-well 106 and each of two n-type drain contacts 130 is respectively formed in each of two drain regions 112. Channel well 118 is a p-type region formed in n-well 106. N-type source regions 120 are formed in channel well 118 and are spaced apart by the back-gate contact 136. Source contacts 132 are n+ regions formed in source regions 120. Gates 124 include patterned polysilicon layers (gate layers) formed into polysilicon gate electrodes over gate insulating layers such as gate oxide layers 125 and field oxide layers 122. Silicide layers 138 are conductive layers that are formed in contact with the gates 124, drain contacts 130, source contacts 132 and back-gate contact 136. Back-gate contact 136 is formed so as to be in contact with the channel well 118. Silicide layers 138 provide ohmic contacts and high conductivity. Of note, the silicide layer 138 on source contacts 132 and back-gate contact 136 shorts these components together in this example. Thus, the sources and back-gate are conductively connected in this configuration. This is known as an integrated back-gate (IBG) configuration. Coupling the back-gate to the source is often used in circuits using LDMOS transistors. The conductivity of the LDMOS transistors between their respective sources and drains is controlled by gates 124, which cause channels to form under the gates in channel wells 118 under the gate oxide layers 125. Field oxide layers 122, the extension of drain regions 112 under field oxide layers 122 and the gradation of doping from drain contacts 130 to drain regions 112 and n-well 106 distribute the electric fields applied to the LDMOS transistors to provide a high voltage handling capability. Higher voltage capability can be increased by increasing the width of field oxide layers 122 under gates 124 and beyond.

Figure 3:
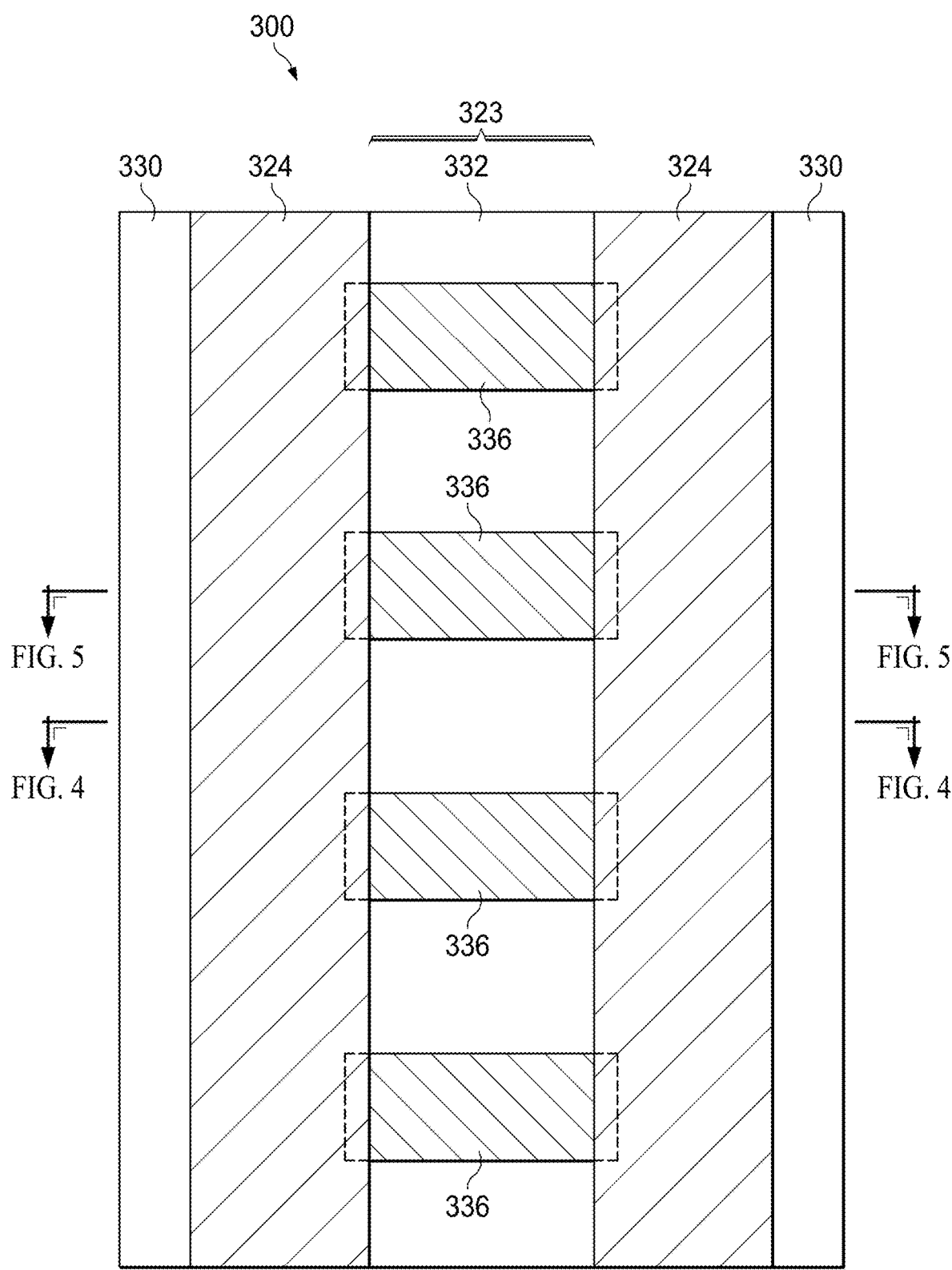
FIG. 3 is a plan view of an example baseline LDMOS transistor.

A key figure of merit for LDMOS transistors is the specific on resistance (Rsp). Rsp is defined as the source/drain resistance (RSD) times the width of the device (W) times the half pitch (HP), which is the distance from the center of the source contact to the center of the drain contact. In the example of FIGS. 1-3, the source and back-gate are coupled together, so the center of the "source contact" is at a distance halfway between the gates. The lower the Rsp, the lower the on resistance of the resistor, and thus the less power is consumed to drive the transistor and the greater the driving capability of the LDMOS for a given size of the LDMOS. Thus, for the same driving capability, an LDMOS transistor with a low Rsp can be smaller than an LDMOS transistor with a higher Rsp. To reduce Rsp, it is desirable to minimize the HP. However, the width of source contacts 132 (FIG. 1) and back-gate contact 136 (FIG. 1) are generally at or near the minimum line width for the manufacturing process or cannot be reduced because of other factors such as current handling requirements or spreading of the dopant.

FIG. 3 is a plan view of an LDMOS transistor 300 implemented in some baseline configurations with a source contact and back-gate contact configuration that helps to reduce the HP. Rather than a single back-gate contact that runs parallel to the transistor gates, e.g. back-gate contact 136, (FIG. 1), one or more back-gate contacts are provided by back-gate contacts 336 that extend across gate gap 323 between and sometimes partially under gates 324. Rather than the single source contact 132 of FIG. 1, the transistor 300 has a plurality of segmented source contacts 332 each between an adjacent pair of back-gate contacts 336. Gates 324 are analogous to the gates 124 (FIG. 1). Drain contacts 330 are analogous to the drain contacts 130 (FIG. 1). Otherwise, features referenced by 3XX generally correspond to or analogous to similar features of FIG. 1 referenced by 1XX.

Figure 4:
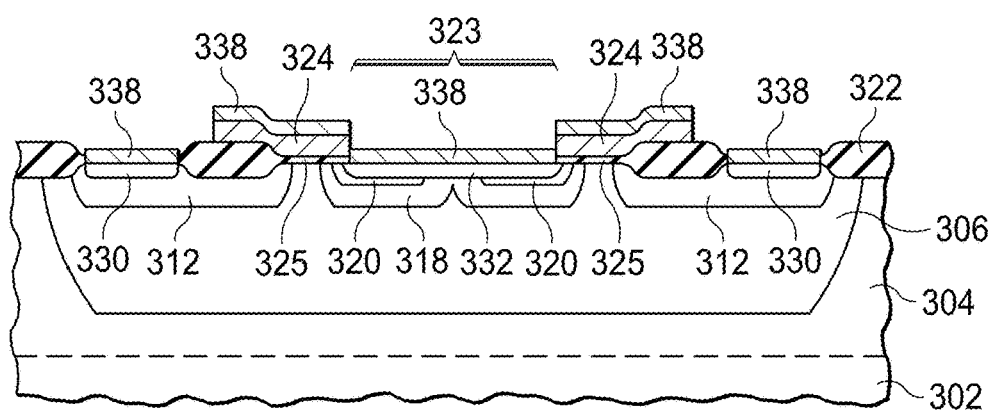
FIG. 4 is a cross section of the example LDMOS transistor of FIG. 4 through the cut line indicated in FIG. 4.

FIG. 4 is a cross section of the LDMOS transistor 300 through the cut line indicated in FIG. 3. Features referenced by 3XX generally correspond to or analogous to similar features of FIG. 1 referenced by 1XX. Shown are substrate 302, epi layer 304, and N-well 306; N-type drain regions 312 and channel well 318 in the N-well 306; sources 320 in the channel well 318; the drain contacts 330 in the drain regions 312; field oxide layers 322 and gate oxide layers 325; gates 324 and silicide layers 338. At the cut line of FIG. 4, source contact 332 extends across the gate gap 323. As shown in FIG. 4, source contact 332 extends partially under gates 324. Gates 324 may be used to block implantation of source contact dopants such that the source contacts 332 are self-aligned to the gates 324. After drive-in, part of the dopant will be diffused under gates 324.

Figure 5:
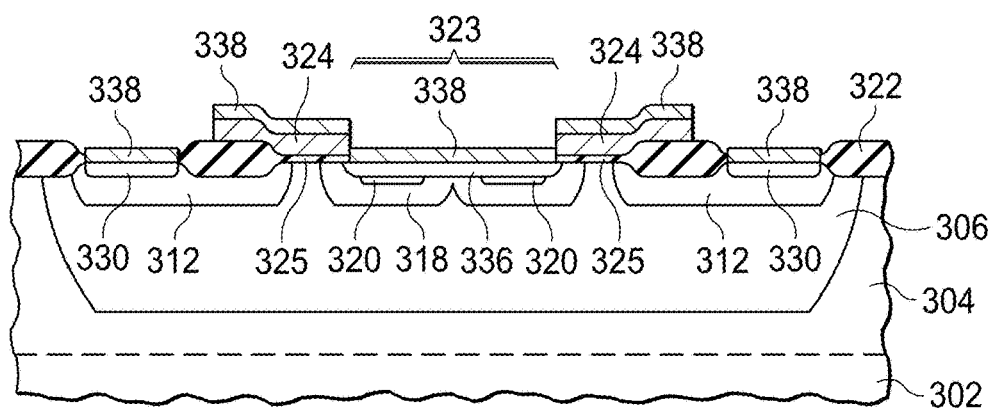
FIG. 5 is a cross section of the example LDMOS transistor of FIG. 4 through the cut line indicated in FIG. 4.

FIG. 5 is a cross section of the LDMOS transistor 300 through the cut line indicated in FIG. 4. As for FIG. 4, features in FIG. 5 referenced by 3XX generally correspond to or are analogous to similar features of FIG. 1 referenced by 1XX. At the cut line of FIG. 5, back-gate contact 336 extends across the gate gap 323 between gates 324. As shown in FIG. 5, back-gate contact 336 extends partially under gates 324. Similar to the source contacts 332, the back-gate contacts 336 are self-aligned to the gates 324, and after drive-in, part of the dopant will be diffused under gates 324.

Referring to FIG. 4, by reconfiguring the back-gate contacts 336 and the source contacts 332 relative to the implementation of FIG. 1, the gap between gates 324 may be shrunk to nearly the minimum dimension of the lithography used to fabricate LDMOS transistor 300. In addition, the number of back-gate contacts 336 can be adjusted to allow for a larger proportion of the area between gates 324 being devoted to source contacts 332, thus lowering the overall source resistance and improving the driving power of LDMOS transistor 300.

However, as can be seen in FIG. 5, the ends of back-gate contact 336 are very close to the interface between sources 320 and channel well 318 under gates 324. This can raise the resistance of sources 320 near channel well 318, e.g. due to reduced source dopant concentration near the interface, thus increasing the overall source to drain resistance (RSD) and thus undesirably raising Rsp.

Figure 6:
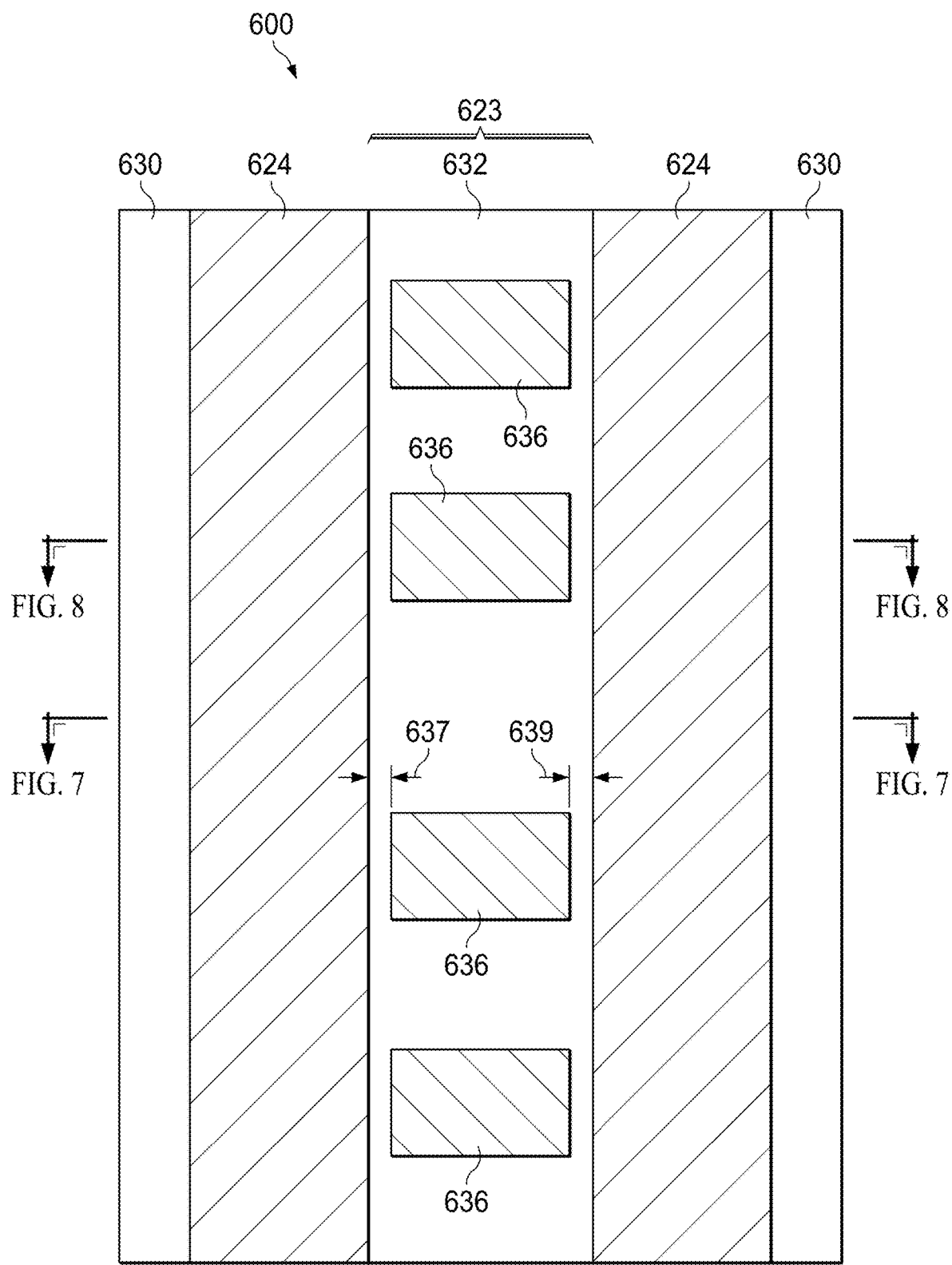
FIG. 6 is a plan view of an example LDMOS transistor.

FIG. 6 is a plan view of an example LDMOS transistor 600 that may advantageously address the problem of excess Rsp of the transistor 300. Like references in FIG. 6 indicate like features in FIGS. 7 and 8. The transistor 600 includes a source contact and back-gate contact configuration that helps to reduce the transistor HP while also reducing the increased resistance that may result from the proximity of the source contacts to the channel region in the transistor 300. Similar to in FIG. 4, the space between gates 624 includes multiple, noncontiguous back-gate contacts 636 (also called herein "back-gate contact region(s)"). Unlike the transistor 400, however, the source contact 632 (also called herein "source contact region") remains contiguous and includes portions located between respective ones of the back-gate contacts 636 and the gates 624. Therefore, in examples of the disclosure back-gate contacts 636 do not extend all the way across gate gap 623 between gates 624. In examples, first back-gate contact gap 637 and second back-gate contact gap 639 are in the rage of 0.05 μm to 0.5 μm. Without implied limitation, first back-gate contact gap 637 and second back-gate contact gap 639 are the same size, but this is not a requirement. Drain contacts 630 provide a similar function to drain contacts 330 (FIG. 3). Features referenced by 6XX generally correspond to or are analogous to similar features of FIG. 1 referenced by 3XX.

Figure 7:
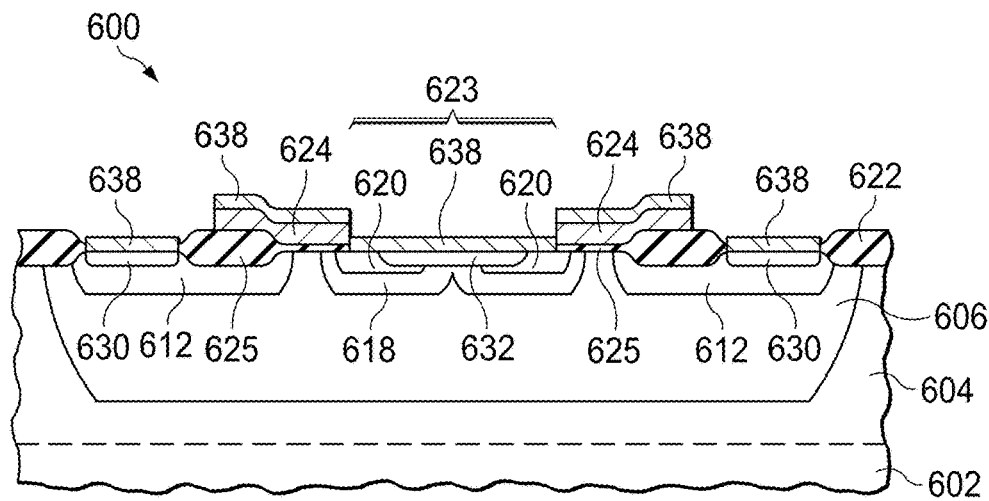
FIG. 7 is a cross section of an example LDMOS transistor through the cut line indicated in FIG. 7.
Figure 8:
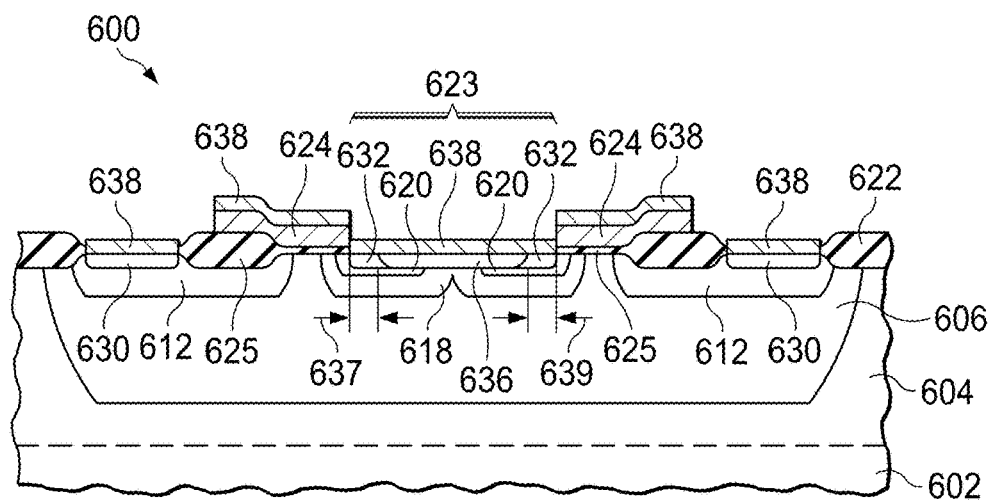
FIG. 8 is a cross section of an example LDMOS transistor through the cut line indicated in FIG. 7.

FIG. 7 is a cross section of the example LDMOS transistor 700 through the cut line indicated in FIG. 6, in which in which like references indicate like features in FIGS. 6 and 8. Shown are substrate 602, epi layer 604, and N-well 606; N-type drain regions 612 and channel well 618 in the N-well 606; sources 620 in the channel well 618; the drain contacts 630 in the drain regions 612; field oxide layers 622 and gate oxide layers 625; gates 624 and silicide layers 638. In the section view of FIG. 7, source contact 632 extends completely across the gap between gates 624. The source contact 632 may be self-aligned to the gate 624 (e.g., the gates 624 may block the source contact 632 implant). While not explicitly shown, after thermal drive-in, the source contact 632 will typically extend partially under the gates 624.

FIG. 8 is a cross section of the example LDMOS transistor 600 through the cut line indicated in FIG. 6, in which in which like references indicate like features in FIGS. 6 and 7. In the view of FIG. 8, back-gate contact 636 extends across the gate gap 623. As shown in FIG. 8, back-gate contact 636 is separated from gates 624 by first back-gate contact gap 637, and second back-gate contact gap 639. Unlike LDMOS transistor 300 (FIG. 3), back-gate contact 636 is not self-aligned to the gates 624 and is spaced apart from the gates 624. Therefore, little if any of the dopant from back-gate contact 636 will diffuse under gates 624. As shown in FIG. 8, portions of the source contact 632 are located between the back-gate contact 636 and the gates 624.

Referring to FIG. 6, LDMOS transistor 600 allows for the gate gap 623 to be shrunk to nearly the minimum dimension of the lithography used to fabricate LDMOS transistor 600 plus first back-gate contact gap 637 and second back-gate contact gap 639. In addition, the number of back-gate contacts 636 can be adjusted to allow for a larger proportion of the area between gates 624 being devoted to source contacts 632, thus lowering the overall source resistance and improving the driving power of LDMOS transistor 600. However, as can be seen in FIG. 8, unlike LDMOS transistor 300 (FIG. 4), the ends of back-gate contact 636 are spaced apart from the interface between sources 620 and channel well 618 under gates 624. This mitigates the effect of back-gate contact 636 on sources 620 and channel well 618.

Figure 9A:
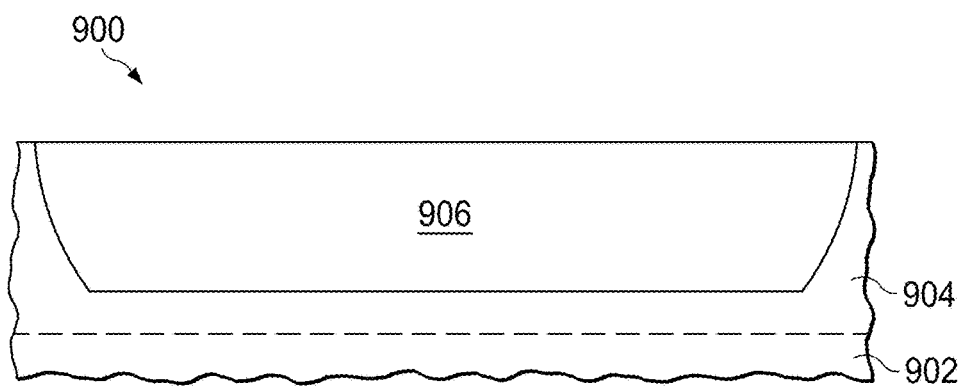
FIGS. 9A-J (collectively "FIG. 9") are cross sectional views illustrating an example process for fabricating the example of FIGS. 6-8.

FIGS. 9A-J (collectively "FIG. 9") are cross sectional views illustrating an example process for fabricating the LDMOS transistor 600. Features referenced by 9XX in FIG. 9 generally correspond to or are analogous to similar features of FIGS. 6-8 referenced by 6XX. The cross sections of FIG. 9 are along the FIG. 8 cut line of FIG. 6. Referring to FIG. 9A, an epitaxial layer 904 is formed on a substrate 902 using epitaxial deposition. The epitaxial layer 904 has a top surface opposite to the substrate 902. In this example, epitaxial layer 904 is p− and substrate 902 is a p+ substrate, which has a resistivity of about 0.015 Ω-cm. The example of FIG. 9 is an n-channel LDMOS enhancement-type transistor 900. In this example, a first conductivity type is p and a second conductivity type is n. In other examples, the first conductivity type is n and the second conductivity type is p. Therefore, these other examples would be p-channel transistors. In other examples, changes in the doping profile of the channel (forming the channel well is further described hereinbelow) can provide a depletion-type transistor. However, depletion-type LDMOS transistors are not commonly used in high-voltage switching applications.

A masked implantation of n-type dopant into epitaxial layer 904, followed by a drive-in step, forms n-well 906 (also called herein "drain well"). An example implantation is n-type dopant, such as phosphorous with a dose of about $4.0 \times 10^{12}$ atoms/cm$^2$ at an energy of about 80 keV. N-well 906 is a low concentration (n−), deep diffusion well.

Figure 9B:
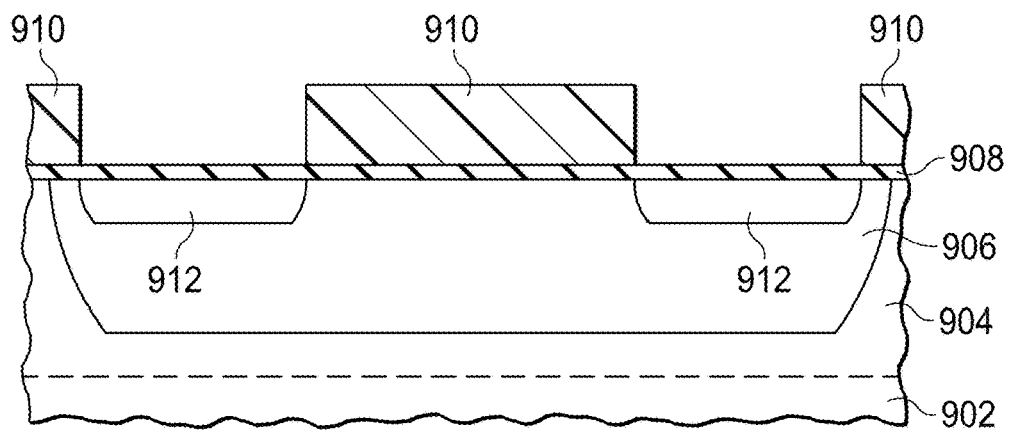

A first oxide layer 908 is then deposited or grown over the surface of epitaxial layer 904 as shown in FIG. 9B. A layer of first photoresist layer 910 is deposited over oxide layer 908 and patterned and etched. An implantation of n-type dopant, such as phosphorous with a dose of about $8.0 \times 10^{12}$ atoms/cm$^2$ at an energy of about 80 keV, is then implanted using first photoresist layer 910 to form drain regions 912 after drive-in of the implantation.

Figure 9C:
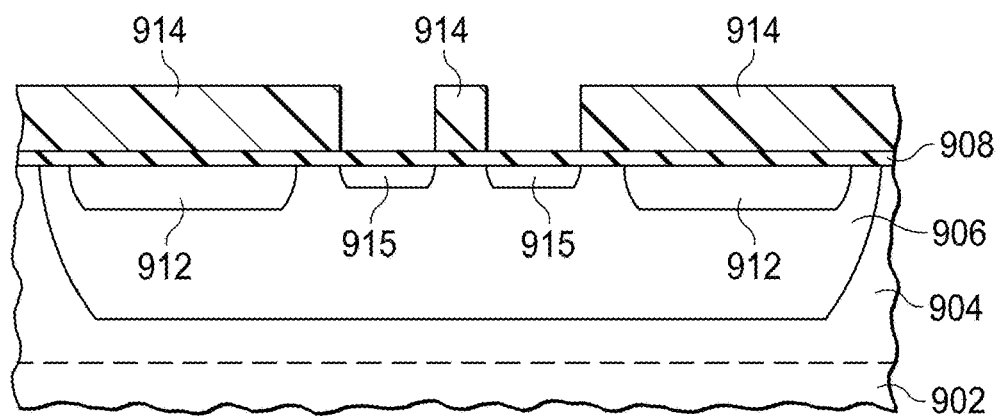

Referring to FIG. 9C, first photoresist layer 910 is removed using a wet cleaning or ashing, for example, and a second photoresist layer 914 is deposited and patterned over first oxide layer 908. Implants of p-type and n-type dopants, with the n-type dopant having substantially less diffusivity than the p-type dopant, are performed resulting in implants 915 as shown in FIG. 9C. A suitable p-type dopant is boron with a dose of about $1.0 \times 10^{14}$ atoms/cm$^2$ at an energy of about 35 keV. A suitable n-type dopant is arsenic with a dose of about $1.0 \times 10^{15}$ atoms/cm$^2$ at an energy of about 35 keV.

Figure 9D:
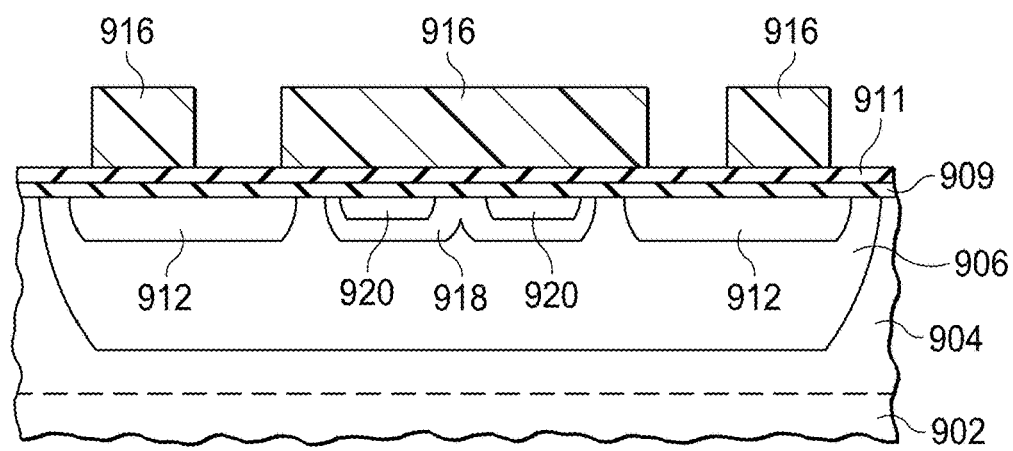
Figure 9E:
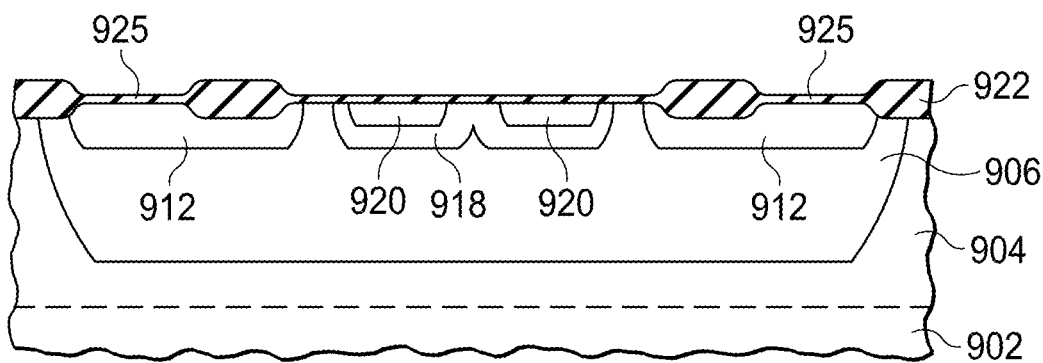

Referring to FIG. 9D, second photoresist layer 914 is then removed using a wet cleaning or ashing, for example. Prior to further processing, a drive-in step, for example 80 minutes at 1100° C., is performed to diffuse the n-type and p-type implants in n-well 906 with the result that the deeper p-type implant forms the channel well 918, while the shallower n-type implants form n-type sources 920. Thus, channel well 918, and sources 920 are formed using the same mask (second photoresist layer 914). First oxide layer 908 is then removed. A second oxide layer 909 having a thickness of about 400 Å is formed on epitaxial layer 904. A silicon nitride layer 911 is formed on second oxide layer 909 using low pressure chemical vapor deposition (LPCVD) and having a thickness of about 1400 Å. A third photoresist layer 916 is deposited and patterned over silicon nitride layer 911. Silicon nitride layer 911 is then removed where exposed by third photoresist layer 916. Third photoresist layer 916 is then removed. The resulting structure is then subjected to an oxidation step to form field oxide regions 922, as shown in FIG. 9E. In this example, field oxide layers 922 are thermally grown to a thickness of approximately 1000 Å.

Second oxide layer 909 and the remaining portions of silicon nitride layer 911 are then removed, for example by plasma etching. A gate oxide layer 925 is then thermally grown on exposed portions of epitaxial layer 904 to a thickness of about 150 Å, resulting in the oxide layers 922, 925 shown in FIG. 9E. An optional low voltage threshold adjust Vt implant may then be performed through gate oxide layers 925, which will include the portion of channel well 918 near the surface of epitaxial layer 904.

Figure 9F:
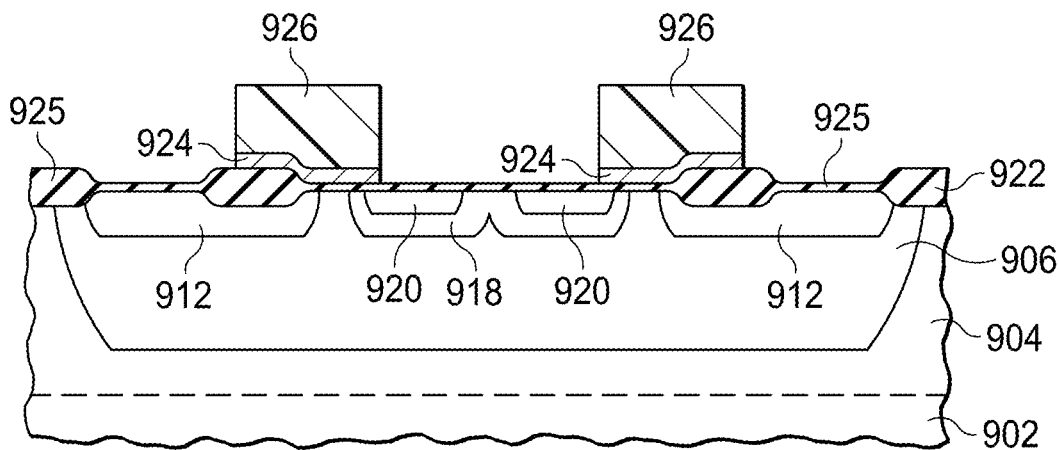
Figure 9G:
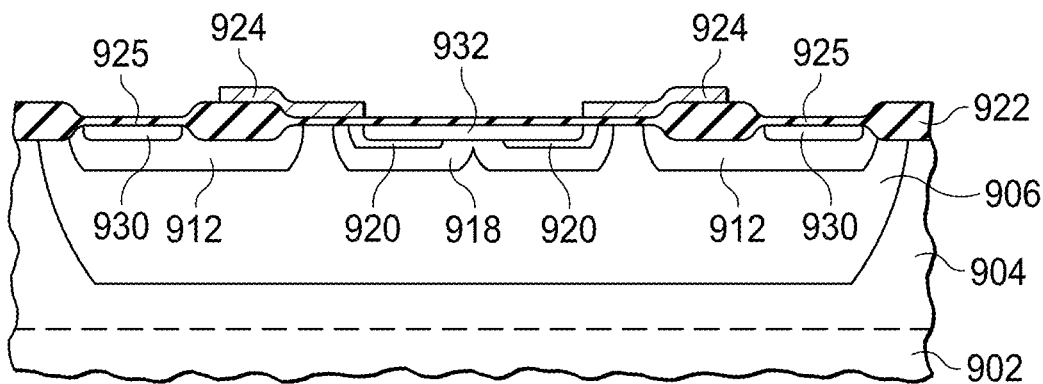

In an example, a gate layer, consisting of a polysilicon layer, for example, with a thickness of about 1500 Å is then deposited over gate oxide layers 925 and field oxide layers 922 and doped with an impurity, such as phosphorus, to render it conductive. Fourth photoresist layer 926 is deposited and patterned over the polysilicon layer. The gate layer is then etched using fourth photoresist layer 926 as a mask to form gates 924 as shown in FIG. 9F. Fourth photoresist layer 926 is then removed.

An implant of an n-type impurity, such as phosphorus with a dose of about $4.0 \times 10^{14}$ atoms/cm$^2$ at an energy of about 80 keV followed by arsenic with a dose of about $5.0 \times 10^{15}$ atoms/cm$^2$ at an energy of about 120 keV is then performed to form n+ source contacts 932 and n+ drain contacts 930. In some examples a fifth photoresist layer (not shown) is used as a mask, while in others the implant is self-aligned to the gates 924 and the gate oxide layer 925. Even when a mask is used, the implant may be self-aligned to the gates 924. This implantation is sometimes called the n-type source/drain (NSD) implantation, and results in the structure shown in FIG. 9G. N+ source contacts 932 are formed in sources 920 and N+ drain contacts 930 are formed in drain regions 912 using one implantation. If used, the fifth photoresist layer (not shown) is then removed. N+ source contacts 932 and n+ drain contacts 930 are then annealed.

Figure 9H:
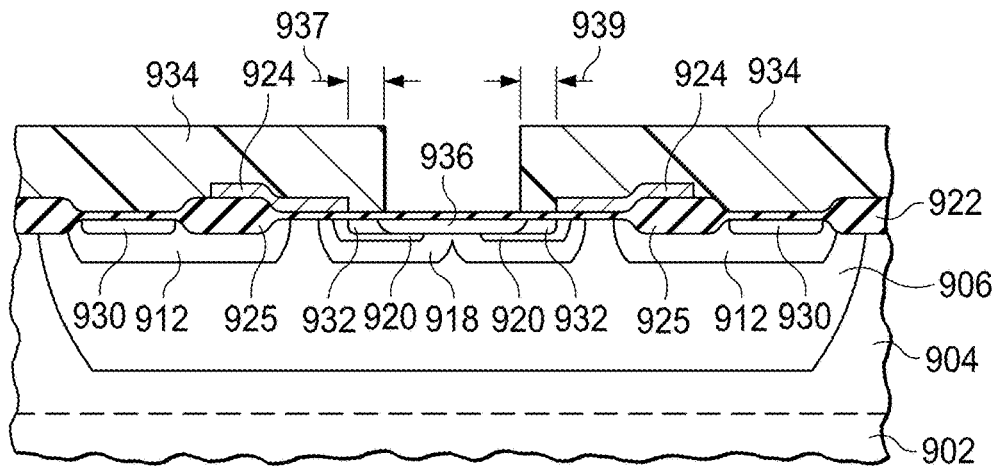

Sixth photoresist layer 934 is then formed and patterned as shown in FIG. 9H to create openings over the areas corresponding to the FIG. 8 cut line shown in FIG. 6. The photoresist is left unexposed in areas corresponding to the FIG. 8 cut line in FIG. 6. A p-type dopant, for example boron with a dose of about $2.0 \times 10^{15}$ atoms cm$^2$ at an energy of about 25 keV, is then implanted to form p+ back-gate contact 936 to provide conductive contact to channel well 918. Because this implant is also used to form p-type source and drain contacts in other parts of the integrated circuit, this implant is sometimes called the p-type source/drain implant (PSD). No implant occurs in portions of the source contact 932 between adjacent back-gate contacts 936. The portions of the source contact 932 on either side of the back-gate contact 936 correspond to the channel gaps 937 and 939 (corresponding to channel gaps 637 and 639 in FIG. 6, respectively). Sixth photoresist layer 934 is then removed and back-gate contact 936 is annealed.

Figure 9I:
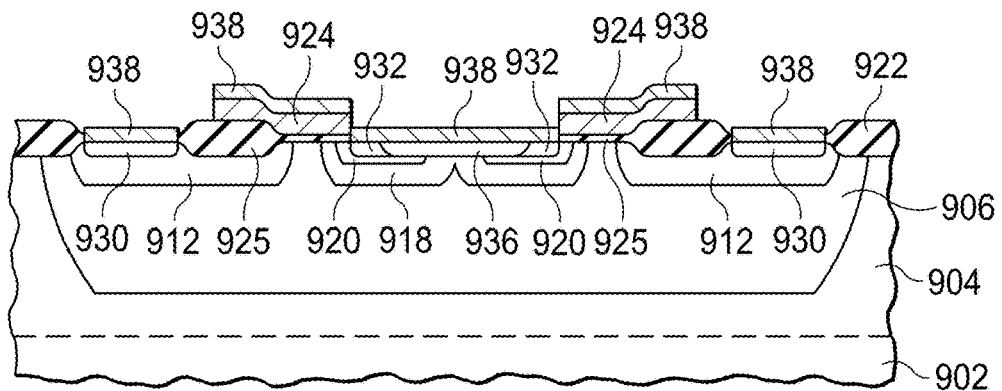

Optionally, a layer of silicon dioxide, silicon nitride or a combination of the two may (not shown) be deposited overall and then removed using anisotropic plasma etching to form sidewalls (not shown) on gates 924. The portions of gate oxide layer 925 not covered by gates 924 (and the optional sidewalls) are then removed using plasma etching, for example. A layer of siliciding metal (not shown) is then deposited overall. Examples of a suitable siliciding metal are molybdenum and titanium. An annealing step then causes a portion of gates 924, drain contacts 930, source contacts 932 and back-gate contact 936 to react with the siliciding metal to form silicide layers 938. The remaining portion of the siliciding metal layer is then removed. In this example, the silicide layers 938 on source contacts 932 and back-gate contact 936 are conductively coupled to source contacts 932 and back-gate contact 936, thus providing an integrated back-gate (IBG) structure. The resulting structure is shown in FIG. 9I.

Figure 9J:
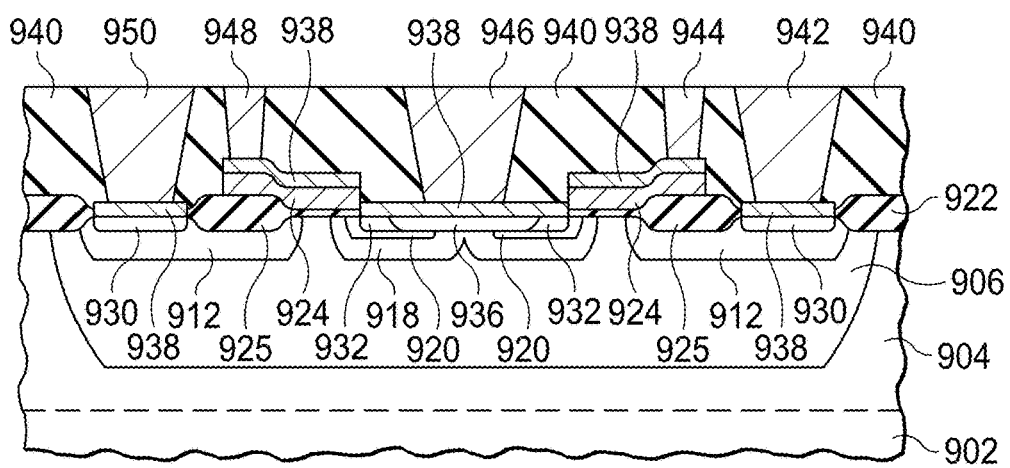

An interlevel oxide layer 940 is then deposited as shown in FIG. 9J. A seventh photoresist layer (not shown) is deposited and patterned on interlevel oxide layer 940. The seventh photoresist layer is used to form openings in interlevel oxide layer 940 to expose silicide layers 938. The openings are filled with via 942, via 944, via 946, via 948 and via 950, which include conductive materials, as titanium, tungsten, a combination of the two, or other conductive materials. Via 942, via 944, via 946, via 948 and via 950 provide conductive connections to drain regions 912, sources 920 and channel well 918, respectively, to an interconnection metal layer (not shown) on interlevel oxide layer 940.

Figure 10A:
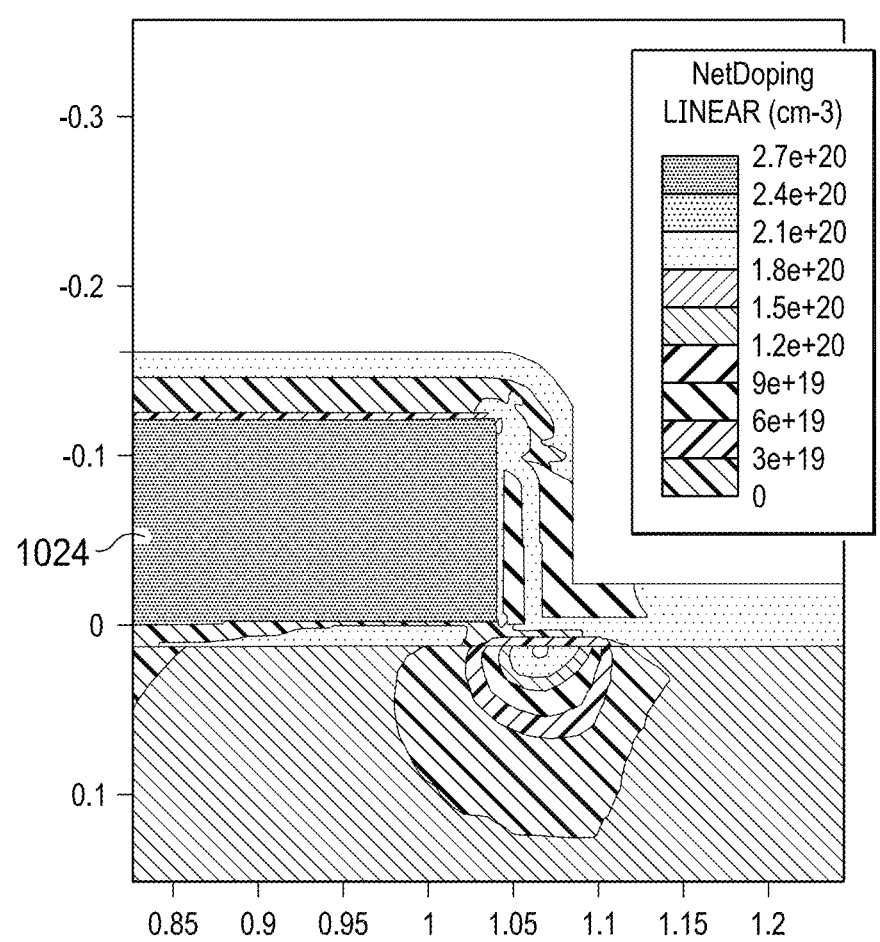
FIGS. 10A-10C (collectively "FIG. 10") are computer simulations of cross sections showing the arsenic doping levels in example LDMOS transistors.
Figure 10B:
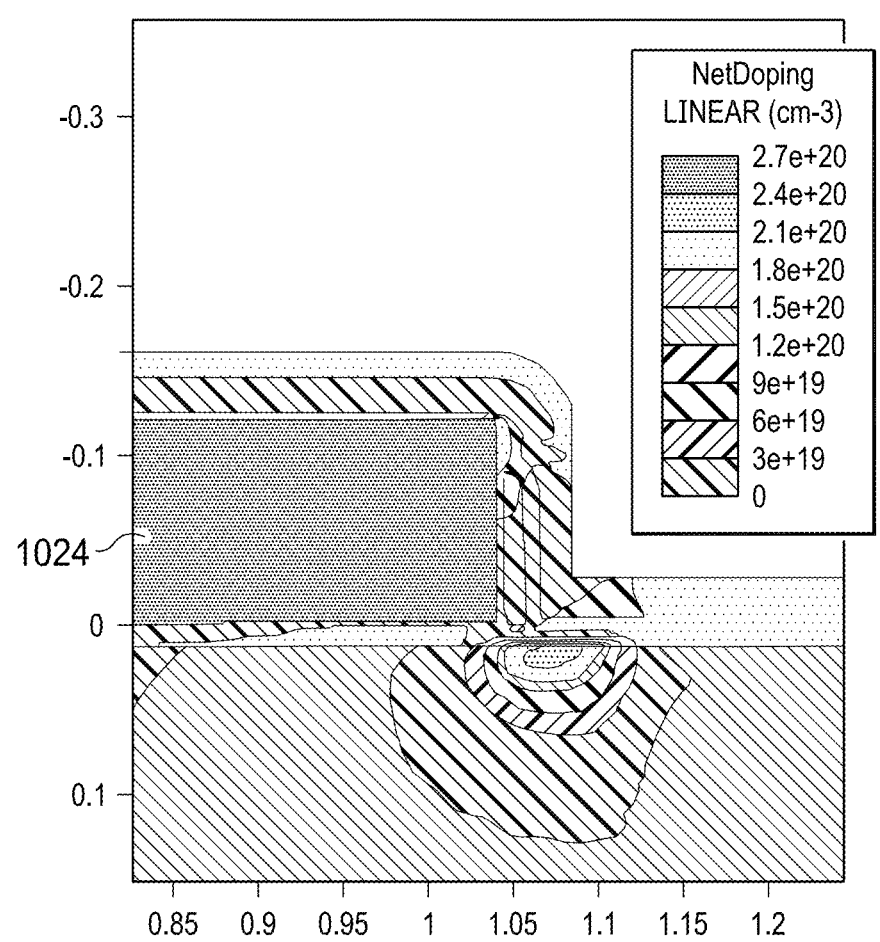
Figure 10C:
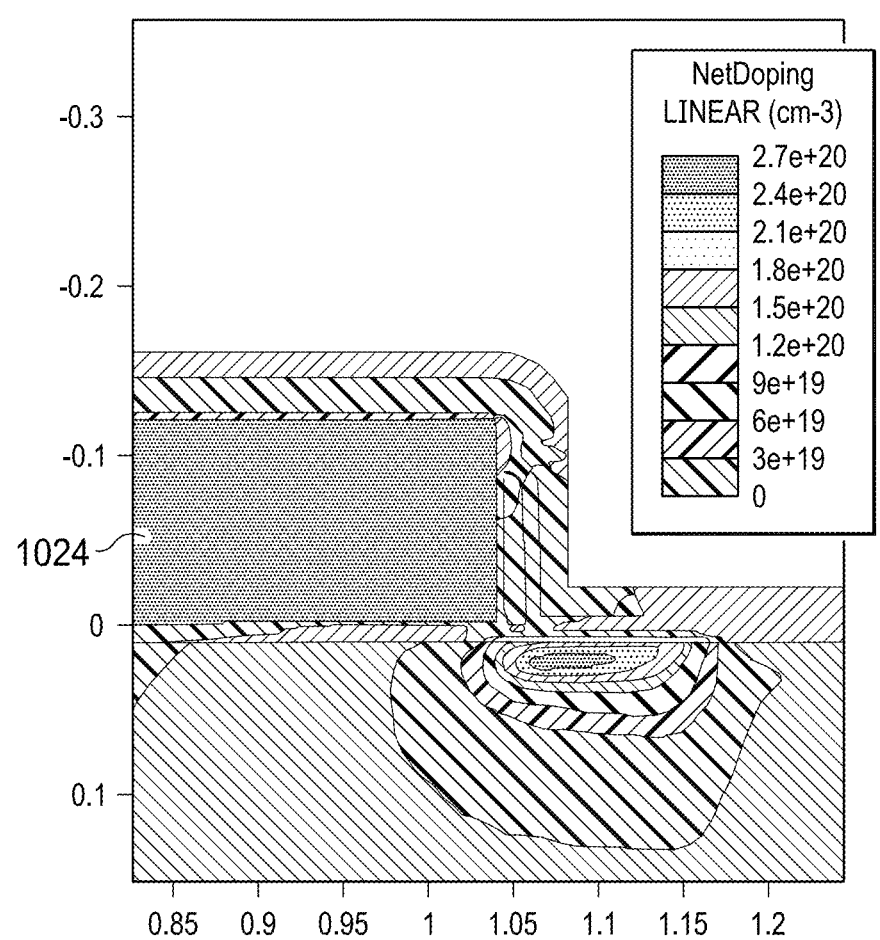

FIGS. 10A-10C (collectively "FIG. 10") are computer simulations of cross sections of example LDMOS transistors showing the arsenic doping levels at the edge of gate 1024, which is analogous to the gates 724 of the example LDMOS transistor 600 (FIGS. 6-8). These simulations only show the effective arsenic doping after NSD implant and do not show other dopants in the devices. The cross sections of FIG. 10 represent the section of FIG. 6 taken through the back-gate contact 636, shown in section view in FIG. 8. FIG. 10A corresponds a first case in which the first and second channel gaps 637, 639 are 0 µm; FIG. 10B corresponds a second case in which the first and second channel gaps 637, 639 are 0.10 µm; and FIG. 10C corresponds a third case in which the first and second channel gaps 637, 639 are 0.15 µm. In the described examples, the NSD implant includes arsenic to form sources 920 (FIG. 9) along with boron to form channel well 918 (FIG. 9). FIG. 10A shows that, for the example of first and second back-gate contact gaps 637, 639 of 0 µm, the arsenic doping of the source 620 (FIG. 8) is heavily counter-doped. FIG. 10B shows that for the example of first and second back-gate contact gaps 637, 639 of 0.10 µm, the arsenic doping of source 620 (FIG. 8) is significantly less counter-doped. FIG. 10C shows that for the example of first and second back-gate contact gaps 637, 639 of 0.15 µm, the arsenic doping of source 620 (FIG. 8) has very little counter-doping. With the example of FIG. 10C, and to a lesser extent FIG. 10B, it can be expected that the portion of source 620 (FIG. 6) will provide significant conductivity when LDMOS transistor 600 (FIG. 6) is on, thus lowering RSD and thus Rsp.

Data were obtained on multiple devices on multiple substrates for baseline LDMOS transistors consistent with those in example integrated circuit 100, and for example transistors consistent with the LDMOS transistor 600. LDMOS transistors in the former set are sometimes referred to as "low DWELL arsenic" transistors due to the minimal concentration of arsenic in the DWELL between the back-gate contact 636 and the channel and counter-doping of a portion of source 620 by back-gate contact 636. LDMOS transistors in the latter set are sometimes referred to as "high DWELL arsenic" transistors due to the elevated concentration of arsenic in the DWELL between the back-gate contact 636 and the channel resulting from the back-gate contact gaps 637, 639. The high DWELL arsenic transistors were found to have a significantly lower Rsp than the low DWELL arsenic transistors, as summarized in Table 1. The reduction of Rsp was found to be the greater for those transistors configured to operate at a lower drain voltage. This is interpreted as being due to the extension of the drain in the higher voltage transistors. Thus, the source/channel well resistance is a smaller portion of the overall RSD. The reduction of Rsp represents a significant design advantage, e.g. for area reduction of such transistors, and is especially so for the 5 V transistor example.

TABLE 1

| Nominal Drain Voltage (V) | Rsp Reduction |
| --- | --- |
| 5 | 7.0% |
| 7 | 5.2% |
| 13 | 4.3% |
| 20 | 3.8% |

Table 2 presents results from characterizing the "snap back current" of variants of an LDMOS transistor consistent with the transistor 600. The snap back current is the unit current through the transistor at which the voltage between the drain and the source reaches a maximum before the transistor breaks down and the voltage rapidly drops as the current increases. The snap back current $I_{ds}$ (or voltage $V_{ds}$) is typically characterized at each of several values of the gate-to-source voltage $V_{gs}$. The $V_{ds}$ and $I_{ds}$ at which breakdown occurs for a particular $V_{gs}$ defines one point of a locus of points that define the extent of an envelope of V-I values in which the transistor may be safely operated. The V-I values within this envelope are sometimes referred to as the safe operating area, or SOA.

In Table 2, normalized values of the current at which breakdown occurs are shown for the case that $V_{gs}=1$ V. An "N/P ratio" represents the ratio of total area occupied by the source contacts 632 in the gate gap 623 to the total areas occupied by the back-gate contact 636. The "PSD pullback" represents the width of the back-gate contact gaps 637, 639, shown for the example of zero (no pullback, or the back-gate contact gaps 637, 639 having nil width) and the example of 0.1 μm.

The values in Table 2 indicate that the snap back current generally increases with decreasing N:P ratio, and is greater for the 0.1 μm pullback than for no pullback for all N:P values. In the case of N:P=1:2 the snap back current is about twice the value for 0.1 μm pullback as compared to no pullback. This example is illustrative of the benefit that results from the non-zero PSD pullback, as the snap back V-I points taken at various values of $V_{gs}$ will define a larger SOA.

TABLE 2

| N:P Ratio | PSD Pullback | Weakest Isnap (Normalized, Vgs = 1 V) |
| --- | --- | --- |
| 2:1 | 0.0 | 1.44 |
| 1:1 | 0.0 | 1.00 |
| 1:2 | 0.0 | 25.0 |
| 2:1 | 0.1 | 2.79 |
| 1:1 | 0.1 | 18.1 |
| 1:2 | 0.1 | 55.6 |

Thus, transistors consistent with the transistor 600 may provide lower transistor half-pitch, lower Rsp and greater SOA than otherwise similar baseline transistors, all three attributes providing valuable improvements for robust integrated circuit designs.

As is the case for MOS devices in general, the conductivity types of the structures described above with reference to FIGS. 1-9 may be reversed. In general, reference can be made to a first conductivity type and second conductivity type, which may be n-type and p-type respectively, or p-type and n-type respectively.

Modifications are possible in the described examples, and other examples are possible, within the scope of the claims.

What is claimed is:

1. An integrated circuit comprising:
  a semiconductor substrate having a first conductivity;
  a drain region having a second conductivity in the semiconductor substrate, the drain region extending in a first direction;
  a first gate insulating layer on the drain region extending in the first direction;
  a first gate on the first gate insulating layer, the first gate extending in the first direction;
  a second gate insulating layer extending in the first direction on the drain region, the second gate insulating layer separated from the first gate insulating layer by a gate gap;
  a second gate on the second gate insulating layer, the second gate extending in the first direction and separated from the first gate by the gate gap;
  a first drain having the second conductivity in the drain region extending in the first direction and on an opposite side of the first gate from the gate gap;
  a second drain having the second conductivity in the drain region extending in the first direction and on an opposite side of the second gate from the gate gap;
  a channel well having the first conductivity in the drain region at the gate gap, the channel well extending in the first direction and extending in a second direction perpendicular to the first direction under the first gate and the second gate;
  a first source having the first conductivity formed in the channel adjacent to an edge of the first gate, the first source comprising a first source contact, and the first source extending in the first direction;
  a second source having the first conductivity formed in the channel adjacent to an edge of the second gate, the second source comprising a second source contact, and the second source extending in the first direction and separated from the first source by a channel gap;
  at least one back-gate contact formed in the channel well between the first gate and the second gate, the at least one back-gate contact overlying the first source and the second source, and separated from the first gate by a first back-gate contact gap defined by a top surface of the first source contact coplanar with a top surface of the at least one back-gate contact and separated from the second gate by a second back-gate contact gap defined by a top surface of the second source contact coplanar with the top surface of the at least one back-gate contact;
the first and second source contacts formed in the channel well in the gate gap except at the at least one back-gate contact; and
a conductive layer formed in contact with the at least one back-gate contact, the first source contact and the second source contact.

2. The integrated circuit of claim 1, wherein the first back-gate contact gap is between 0.05 μm and 0.5 μm.

3. The integrated circuit of claim 1, wherein the second back-gate contact gap is between 0.05 μm and 0.5 μm.

4. The integrated circuit of claim 1, wherein the conductive layer is silicide.

5. The integrated circuit of claim 1, further including:
a first field oxide layer at least partially under the first gate extending in the first direction and extending the second direction between the first gate insulating layer and the first drain; and
a second field oxide layer at least partially under the second gate extending in the first direction and extending the second direction between the second gate insulating layer and the second drain.

6. The integrated circuit of claim 1, wherein the at least one back-gate contact is two or more back-gate contacts.

7. The integrated circuit of claim 1, further including:
a first drain contact having the second conductivity in the first drain and extending in the first direction; and
a second drain contact having the second conductivity in the second drain and extending in the first direction.

8. The integrated circuit of claim 7, wherein the conductive layer is a first conductive layer, and further including:
a second conductive layer on the first drain contact; and
a third conductive layer on the second drain contact.

9. The integrated circuit of claim 8, wherein the second conductive layer and the third conductive layer are silicide.

10. The integrated circuit of claim 1, wherein the first conductivity is p-type and the second conductivity is n-type.

11. An integrated circuit, comprising:
an epitaxial layer over a semiconductor substrate and having a top surface and a first conductivity type;
a first transistor including a first source region and a first drain region that are formed in the epitaxial layer and have a different second conductivity type, and a first gate extending in a length direction between the first source region and the first drain region;
a second transistor including a second source region and a second drain region that are formed in the epitaxial layer and have the second conductivity type, and a second gate spaced apart from the first gate by a gate gap and extending in the length direction between the second source region and the second drain region;
a source contact region having the second conductivity type and located between the first and second gates, the source contact region comprising a first source contact touching the first source region and a second source contact touching the second source region; and
a back-gate contact region having the first conductivity type overlying the first and second source regions, a top surface of the back-gate contact region surrounded by the source contact region, the back-gate contact region touching a channel well having the first conductivity type and extending under the first gate toward the first drain region and under the second gate toward the second drain region, and the back-gate contact region spaced apart from the first gate by a first back-gate contact gap defined by a top surface of the first source contact coplanar with the top surface of the back-gate contact region and from the second gate by a second back-gate contact gap defined by a top surface of the second source contact coplanar with the top surface of the back-gate contact region.

12. The integrated circuit of claim 11, wherein the source contact region is doped with arsenic in the first and second back-gate contact gaps.

13. The integrated circuit of claim 11, wherein the first and second back-gate contact gaps are between 0.05 μm and 0.5 μm.

14. The integrated circuit of claim 11, wherein the back-gate contact region is one of a plurality of back-gate contact regions spaced apart between the first gate and the second gate.

15. The integrated circuit of claim 11, wherein the first conductivity type is p-type and the second conductivity type is n-type.

16. An integrated circuit, comprising:
an epitaxial layer over a semiconductor substrate and having a top surface and a first conductivity type;
a first transistor including a first gate between a first source region and a first drain region that are formed in the epitaxial layer and have a different second conductivity type, the first gate extending along the first source region in a length direction;
a second transistor including a second gate between a second source region and a second drain region that are formed in the epitaxial layer and have the second conductivity type, the second gate spaced apart from the first gate by a gate gap and extending along the second source region in the length direction;
a source contact region having the second conductivity type and located between the first and second gates, the source contact region comprising a first source contact touching the first source region and a second source contact touching the second source region; and
a back-gate contact region having the first conductivity type and surrounded at a top surface by the source contact region, the back-gate contact region overlying the first and second source regions and touching a back-gate well having the first conductivity type and extending under the first gate toward the first drain and under the second gate toward the second drain, and the back-gate contact region spaced apart from the first gate by a first back-gate contact gap defined by a top surface of the first source contact coplanar with the top surface of the back-gate contact region and from the second gate by a second back-gate contact gap defined by a top surface of the second source contact coplanar with the top surface of the back-gate contact region.

17. The integrated circuit of claim 16, wherein the source contact region is doped with arsenic in the first back-gate contact gap.

18. The integrated circuit of claim 16, wherein the first back-gate contact gap between the source contact region and the first gate is between 0.05 μm and 0.5 μm.

19. The integrated circuit of claim 16, wherein the back-gate contact region is one of a plurality of back-gate contact regions spaced apart between the first gate and the second gate.

20. The integrated circuit of claim 16, wherein the first conductivity type is p-type and the second conductivity type is n-type.

\* \* \* \* \*